United States Patent
Roesner et al.

(10) Patent No.: US 6,307,422 B1
(45) Date of Patent: Oct. 23, 2001

(54) CIRCUIT CONFIGURATION HAVING SINGLE-ELECTRON COMPONENTS, A METHOD FOR ITS OPERATION AND USE OF THE METHOD FOR ADDITION OF BINARY NUMBERS

(75) Inventors: Wolfgang Roesner; Ties Ramcke, both of Munich; Lothar Risch, Neubiberg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/516,658

(22) Filed: Mar. 1, 2000

Related U.S. Application Data

(63) Continuation of application No. PCT/DE98/02521, filed on Aug. 26, 1998.

(30) Foreign Application Priority Data

Sep. 1, 1997 (DE) ............................................... 197 38 115

(51) Int. Cl.$^7$ .................................................. H03K 17/687
(52) U.S. Cl. ............................................ 327/427; 327/574
(58) Field of Search ............................... 326/136; 257/24, 257/27, 30; 327/603, 574, 579, 427

(56) References Cited

U.S. PATENT DOCUMENTS

| 5,646,559 | * | 7/1997 | Higurashi | 326/136 |
| 5,677,637 | * | 10/1997 | Nakazato | 326/136 |
| 5,838,021 | * | 11/1998 | Ancona | 257/30 |

FOREIGN PATENT DOCUMENTS

| 42 12 220 A1 | 10/1993 | (DE) | H01L/29/267 |
| 0 562 751 A2 | 9/1993 | (EP) | H03K/19/08 |
| 0 802 633 A1 | 10/1997 | (EP) | H03K/19/02 |

OTHER PUBLICATIONS

"A Charge–Transfer–Device Logic Cell" (Mok et al.), Solid State Electronics 1974, vol. 17, pp. 1147–1154.

"A Possible Nanometer Scale Computing Device Based on an Adding Cellular Automaton" (Benjamin et al.), Applied Physics, Letter 70, Apr. 1997, pp. 2321–2323.

"Single–Electron Majority Logic Circuits" (Wamura), IEICE Trans Electron, vol. E 81, Jan. 1998, pp. 42–48.

"Single Electron–Photon Logic Device Using Coupled Quantum Dots: Computation with the Fock Ground State" (Nomoto et al.), Applied Physics, vol. 79, No. 1, Jan. 1996, pp. 291–300.

"Simulation of Single Electron Circuits" (Rösner et al.), Elsevier Science 1995, pp. 55–58.

"Complementary Digital Logic Based on the 'Coulomb Blockade'" (Tucker), Applied Physics, No. 72, Nov. 1992, pp. 4399–4413.

* cited by examiner

Primary Examiner—Toan Tran
(74) Attorney, Agent, or Firm—Herbert L. Lerner; Laurence A. Greenberg; Werner H. Stemer

(57) ABSTRACT

At least one single-electron transistor is provided in a circuit configuration having single-electron components, and is connected between a first main node and a second main node. The first main node is capacitively connected between a first operating voltage connection and a second operating voltage connection. The gate electrode of the single-electron transistor is connected to a control voltage connection. The circuit configuration is suitable for logic operations on binary numbers, whose digits are stored at the first and second main nodes.

12 Claims, 15 Drawing Sheets

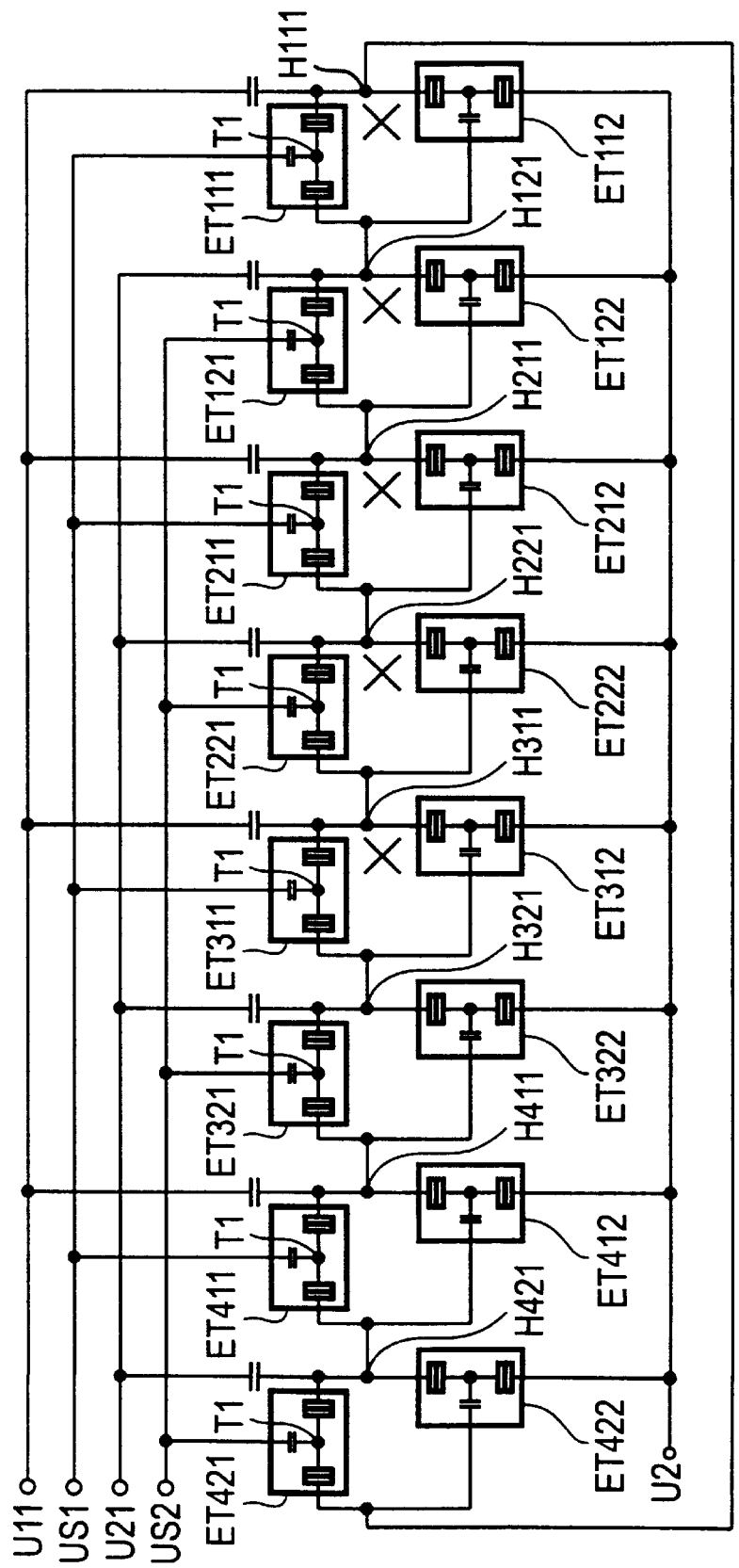

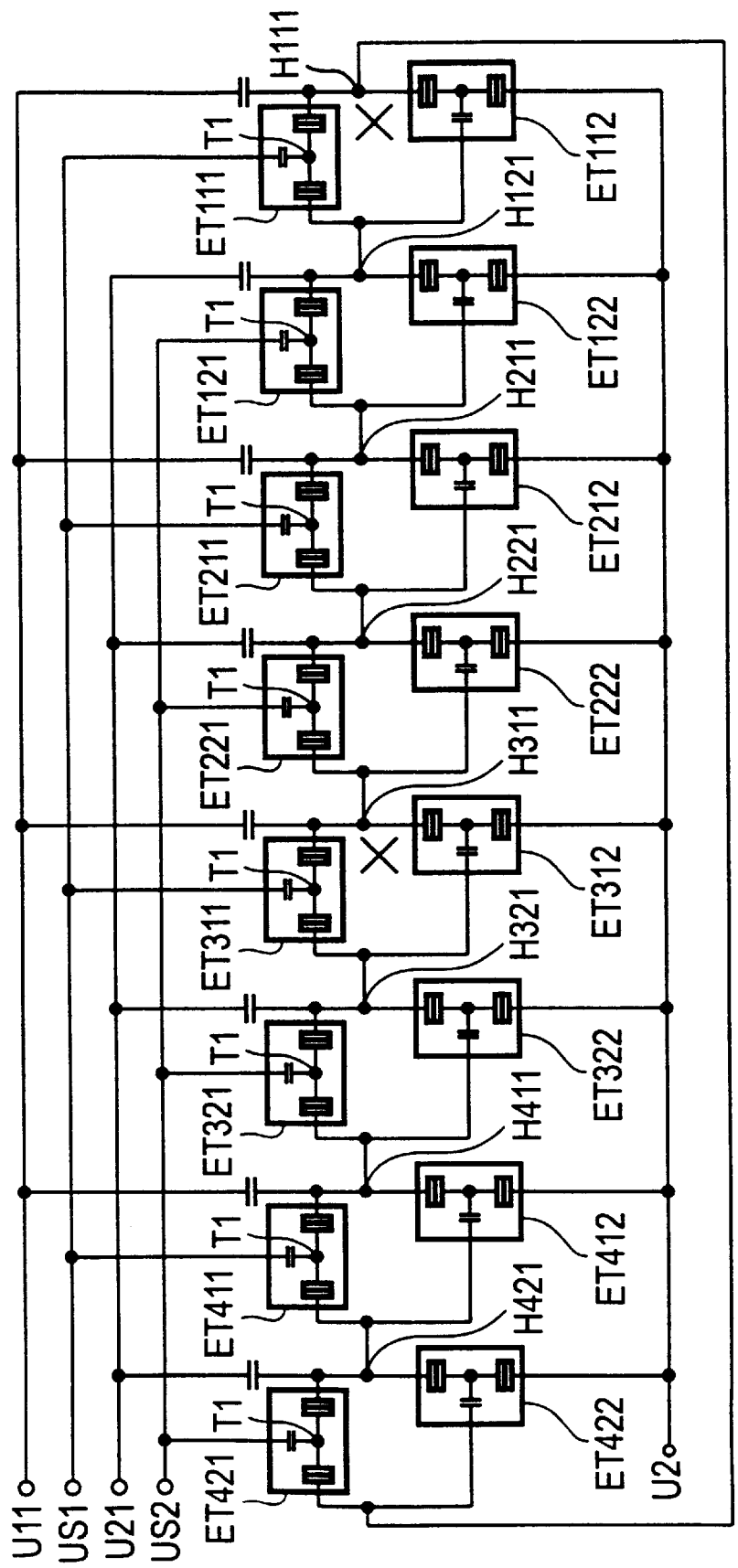

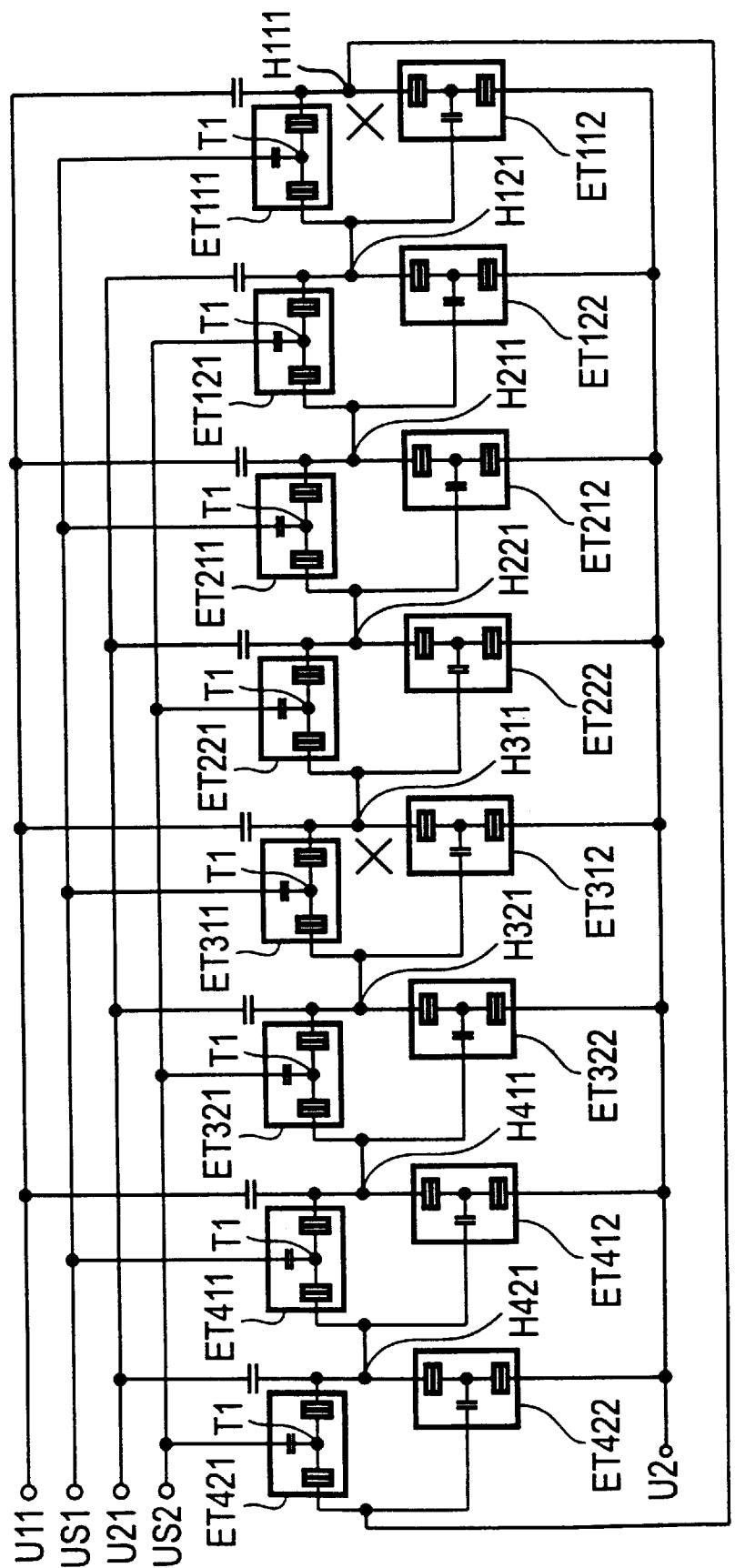

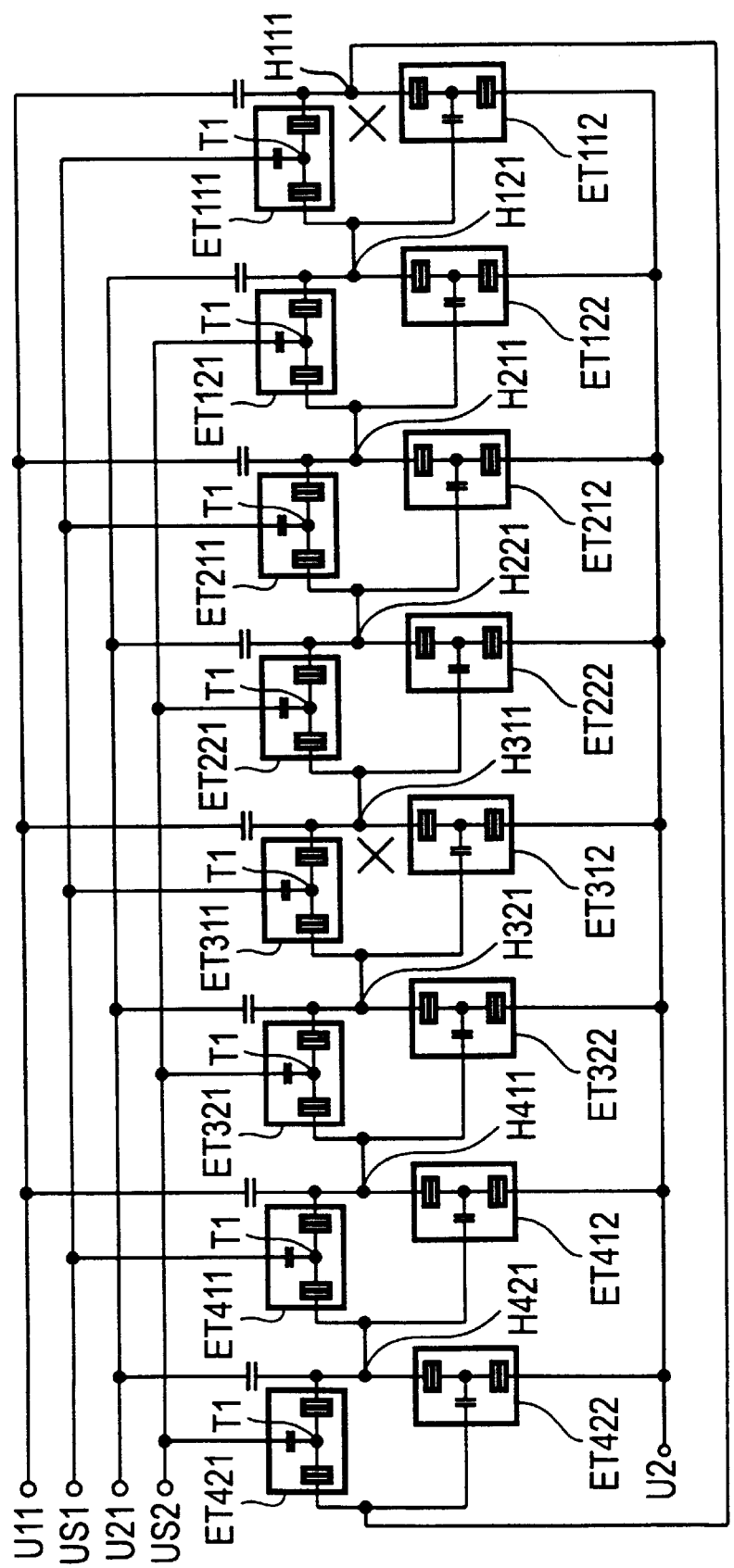

CIRCUIT CONFIGURATION HAVING SINGLE-ELECTRON COMPONENTS, A METHOD FOR ITS OPERATION AND USE OF THE METHOD FOR ADDITION OF BINARY NUMBERS

CROSS-REFERENCE TO RELATED APPLICATION

This is a continuation of copending international application PCT/DE98/02521, filed Aug. 26, 1998, which designated the United States.

BACKGROUND OF THE INVENTION

Field of the Invention

The invention relates to a circuit configuration having single-electron components and which is suitable, inter alia, for use as a logic circuit.

At the present time, integrated circuit configurations for logic applications generally use CMOS technology. As components progressively become smaller, this conventional CMOS technology is reaching its limits.

With regard to further miniaturization, so-called single-electron components have been proposed, in which switching processes are carried out using individual electrons. An investigation into such single-electron components is known, for example, from W. Rösner et al, Microelectronic Engineering, Volume 27, 1995, pages 55 to 58. Single-electron components are tunnel elements that are connected to adjacent connections via tunnel contacts. Charge movements through these tunnel contacts take place both by means of the quantum-mechanics tunnel effect and simply by thermally overcoming a potential barrier, in which these charge movements occur sufficiently rarely. The tunnel elements are, for example, in the form of small conductive islands that are surrounded by an insulating structure. If a voltage U that satisfies the condition for Coulomb blockade is applied to the two connections, that is to say whose magnitude is:

$$|U| < e/(2C)$$

then the charge of the tunnel element cannot change, because of the potential conditions, provided, for the thermal energy:

$$\frac{kT}{e} \ll \frac{e}{2C}$$

In this case, k is the Stefan Boltzmann constant, T is the temperature, e is the electron charge, and C is the capacitance of the tunnel element.

If a greater voltage is applied, electrons can flow via one of the tunnel contacts to the tunnel element. These single-electron components are operated such that individual electrons move in each case.

By actuating the tunnel element via a gate electrode which capacitively influences the tunnel element without any tunnel movements occurring in the operating voltage range, it is possible to overcome the Coulomb blockade. If the electrical charge acting at the gate electrode is suitable, the single-electron component has an approximately linear current/voltage characteristic that passes through the origin. Such a gate-controlled single-electron component is referred to as a single-electron transistor in the literature.

SUMMARY OF THE INVENTION

It is accordingly an object of the invention to provide a circuit configuration having single-electron components which is suitable, inter alia, for use as a logic circuit, and to provide an operating method for such a circuit configuration which overcomes the hereinafore-mentioned disadvantages of the heretofore-known methods and devices of this general type.

With the foregoing and other objects in view there is provided, in accordance with the invention, a circuit configuration that has at least one first single-electron transistor, which is connected between a first main node and a second main node. The first main node is capacitively connected between a first operating voltage connection and a second operating voltage connection. The gate electrode of the first single-electron transistor is connected to a control voltage connection. The single-electron transistor has a tunnel element which is connected via two tunnel contacts to connections and can be capacitively influenced via a gate electrode. Since the level of the potential barrier between the tunnel element and the respective connection depends on the amount of charge acting on this connection, logic operations can be produced with the aid of the first single-electron transistor. For this purpose, charge carriers that are associated with the logic level are applied to the first main node and to the second main node. For example, an electron is associated with the logic level one, and no electron is associated with the logic level zero.

If there is now no electron at the first main node (logic zero) and an electron at the second main node (logic one), and if the gate electrode of the first single-electron transistor is actuated so that it is possible for current to flow from the second main node to the first main node via the tunnel element, then the electron flows from the second main node to the first main node. If, on the other hand, there is likewise an electron (logic one) at the first main node, then the electron cannot flow from the second main node to the first main node. If there is no electron at the second main node (logic zero) and there is an electron at the first main node (logic one), then the electron remains at the first main node (logic one) with corresponding actuation. If there is no electron at the second main node (logic zero) and no electron at the first main node (logic zero), then there is no electron at the first main node (logic zero) even after actuation of the first single-electron transistor. The charge at the first main node after the logic operation thus indicates the result of an OR operation on the output bits at the first main node and the second main node.

The connection between the first main node and the first operating voltage connection or the second operating voltage connection is provided, for example, via a capacitor.

In accordance with an added feature of the invention, there is provided a second single-electron transistor that is connected between the first main node and the second operating voltage connection. The gate electrode of the second single-electron transistor is connected to the second main node. The charge at the first main node can be varied via the second single-electron transistor. This can be used, for example, to reset the circuit configuration. This embodiment of the circuit configuration furthermore allows relatively complex logic operations, since the actuation of the second single-electron transistor is now dependent on the charge acting at the second main node. The charge located at the first main node can be varied via the second single-electron transistor as a function of the charge located at the second main node.

In accordance with an additional feature of the invention, the circuit configuration has at least one first circuit portion and at least one second circuit portion. The first circuit portion and the second circuit portion in this case each have a first single-electron transistor and a second single-electron transistor that are connected in series with one another via a first main node. The first single-electron transistor and the second single-electron transistor in this case each comprise a tunnel element that is connected via two tunnel contacts to connections and can be capacitively actuated via a gate electrode. Charge movements take place via the tunnel contacts both as a result of the quantum-mechanics tunnel effect and by thermally overcoming a potential barrier. The potential barrier is thermally overcome at a sufficiently low rate. If the tunnel resistance of the tunnel contacts is:

$$R_T > R_k = h/e^2 \approx 26 K\omega$$

where $R_K$ is the Klitzing resistance, h is Planck's constant and e is an electron charge, then the charge carriers are localized on one side of the potential barrier and the majority of the charge movements take place by elementary processes. The tunnel resistance is preferably >100 kω.

The first main node, at which in each case one connection of the first single-electron transistor is connected to one connection of the second single-electron transistor, is connected via a capacitor to a first operating voltage connection. The series circuit comprising the first single-electron transistor and the second single-electron transistor is connected between a second main node and a second operating voltage connection. The gate electrode of the first single-electron transistor is connected to a control voltage connection. The gate electrode of the second single-electron transistor is connected to the second main node. The first main node in the second circuit portion is connected to the second main node in the first circuit portion. Those connections of the first single-electron transistor and of the second single-electron transistor in the second circuit portion which are connected to one another are thus connected to the gate electrode of the second single-electron transistor in the first circuit portion.

In order to provide a cyclic configuration, the second main node in the second circuit portion is connected to the first main node in the first circuit portion. The gate electrode of the second single-electron transistor in the second circuit portion is thus connected to those connections of the first single-electron transistor and of the second single-electron transistor in the first circuit portion which are connected to one another.

In this circuit configuration, electrons can be moved to the first main node and/or to the second main node in the first circuit portion and in the second circuit portion as a function of the actuation of the first single-electron transistors and the voltage at the first operating voltage connection. Furthermore, as a function of the actuation of the first single-electron transistor, electrons can flow from the first main node to the second main node and from the second main node to the first main node, or from one of the main nodes to the tunnel junction of the first single-electron transistor. In this case, use is made of the fact that the level of the potential barrier between the tunnel element and the adjacent main node depends, inter alia, on the amount of charge acting at the main node. Depending on the actuation of the second single-electron transistor, electrons can flow away from the first main node to the second operating voltage connection. The second single-electron transistor is actuated via the voltage which is applied to the gate electrode and is governed on the one hand by the charge located at the second main node, and on the other hand by the voltage applied to the first operating voltage connection in the adjacent circuit portion. This means that the second single-electron transistor can be switched as a function of the charge stored at the second main node. The circuit configuration is thus suitable for carrying out logic operations in accordance with a predetermined truth table. The circuit configuration is in this case particularly suitable for use as a processor, as an adder, as a multiplier, or as a logic gate.

In order to carry out a logic operation between two multi-digit digital information items, for example two binary numbers, it is within the scope of the invention for the circuit configuration to have a plurality of circuit blocks. Each of the circuit blocks contains a first circuit portion and a second circuit portion. In this case, the first circuit portion and the second circuit portion each have a first single-electron transistor and a second single-electron transistor, which are connected in series with one another via a first main node. The first main node is connected via a capacitor to a first operating voltage connection. The series-connected first and second single-electron transistors are connected between a second main node and a second operating voltage connection. The gate electrode of the first single-electron transistor is connected to a control voltage connection. The gate electrode of the second single-electron transistor is connected to the second main node. The second main node in the second circuit portion of one of the circuit blocks is in each case connected to the first main node in the first circuit portion of the adjacent circuit block. The second main node in the second circuit portion of the last circuit block is connected to the first main node of the first circuit block. If n circuit blocks are provided, then the second main node in the second circuit portion of the i-th circuit block where i=1, ... n−1 is respectively connected to the first main node in the first circuit portion of the (i+1)-th circuit block. The second main node in the second circuit portion of the n-th circuit block is connected to the first main node in the first circuit portion of the first circuit block.

If the information to be processed has n digits, and if the logic operation being used has no carry or mathematical sign, then n circuit blocks are required. If the logic information has n digits and a carry or a mathematical sign are required for the logic operation, then n+1 circuit blocks are required for the circuit configuration. For example, this is the situation when the circuit configuration is used as an adder.

If the circuit configuration is operated with a plurality of circuit blocks, such that charge carriers are moved only to the first main nodes in the first circuit portions or only to the first main nodes in the second circuit portions, then the circuit configuration is suitable for use as a shift register.

The capacitor, the first single-electron transistor and the second single-electron transistor in the first circuit portion and in the second circuit portion as well as in all the circuit blocks, if applicable, are, preferably, essentially designed to be electrically identical. This considerably simplifies the production of the circuit configuration and the actuation of the circuit configuration.

Furthermore, with regard to simplified actuation, it is advantageous for the first single-electron transistor in each case to have two tunnel contacts having essentially the same capacitance, and for the second single-electron transistor to have two tunnel contacts having a different capacitance.

Likewise with respect to actuation, it is advantageous to connect the second operating voltage connection in the first circuit portion to the second operating voltage connection in the second circuit portion and, if appropriate, in all the circuit blocks. In operation, the second operating voltage connection is preferably connected to the lower of two operating voltage levels, for example ground.

In order to operate the circuit configuration, a first voltage level is in each case applied to the first operating voltage connection in the first circuit portion, a second voltage level is in each case applied to the control connection in the first circuit portion, a third voltage level is in each case applied to the first operating voltage connection in the second circuit portion, and a fourth voltage level is in each case applied to the control connection in the second circuit portion. Depending on the output bits on which the logic operations are to be carried out, the charge carriers are applied to the first main node and to the second main node in the first circuit portion. For example, an electron is applied for the logic value one, and no electron is applied for the logic value zero. The circuit configuration is, for example, operated with voltage profiles which each have three steps.

In this case, in a first step, the values for the first voltage level, the second voltage level, the third voltage level and the fourth voltage level are set such that charge carriers which are located at the second main node in the first circuit portion flow to the first main node in the first circuit portion, provided no charge carriers are already located at this first main node. If there is already a charge carrier at the first main node, then charge carriers which are located at the second main node in the first circuit portion flow to the tunnel junction of the first single-electron transistor in the first circuit portion.

In a second step, the values for the first voltage level, the second voltage level, the third voltage level and the fourth voltage level are set such that charge carriers which are located at the tunnel junction of the first single-electron transistor in the first circuit portion flow to the second main node in the first circuit portion. Depending on the actuation in the first step, the second main nodes in the first circuit portion are in each case depleted. Thus, in the second step, charge carriers are applied only to the second main nodes in those first circuit portions in which a charge carrier had in each case already been applied to the first main node and the second main node before the first step.

In a third step, the values for the first voltage level, the second voltage level, the third voltage level and the fourth voltage level are set such that charge carriers which are located at the first main node in the first circuit portion flow via the second single-electron transistor in the respective first circuit portion to the second operating voltage connection, provided a charge carrier is located at the second main node in the respective first circuit portion. In this step, use is made of the fact that, on actuation of the second single-electron transistor, both the third voltage level which is applied to the first operating voltage connection in the second circuit portion and the amount of charge which is present at the second main node in the first circuit portion are active.

After carrying out these three steps, the following logic operation is obtained for the charge stored at the first main node and the second main node in the first circuit portion:

| Information at the 2nd | Information at the 1st main node | |
|---|---|---|
| main node | 0 | 1 |
| 0 | 00 | 01 |
| 1 | 01 | 10 |

An XOR logic operation is thus carried out on the output bits at the first main node, and an AND logic operation is carried out on the output bits at the second main node.

If only the first and second steps of the voltage profile are carried out, then the following logic operation is obtained for the charge stored at the first main node and the second main node in the first circuit portion:

| Information at the 2nd | Information at the 1st main node | |
|---|---|---|
| main node | 0 | 1 |
| 0 | 00 | 01 |
| 1 | 01 | 11 |

An OR logic operation is thus carried out on the output bits at the first main node, and an AND logic operation is carried out on the output bits at the second main node.

If it is intended to operate the circuit configuration with only the two steps of the voltage profile, then the second single-electron transistor may also be replaced by a capacitor.

The circuit configuration allows logic operations to be carried out in accordance with these truth tables. This does not preclude further logic operation options.

In order to carry out a logic operation on two multidigit digital information items, the corresponding digits are respectively written to the first main node and to the second main node in the first circuit portion of the respective circuit block. A first run is then carried out with the voltage profile corresponding to the described three steps. After this, a second run is carried out, in which the first voltage level and the second voltage level are respectively applied to the first operating voltage connection and to the control voltage connection in the second circuit portion, and the third voltage level and the fourth voltage level are respectively applied to the first operating voltage connection and to the control voltage connection in the first circuit portion. After this, the first to third steps are carried out, with the values for the first, second, third and fourth voltage levels being carried out in the same way as in the first run. In the second run, influences such as carries, which adjacent digits in the digital information have on one another during the logic operation, are processed.

In the case of logic operations which involve carries, a zero is in each case initially written to the first main node and the second main node in the first circuit portion of the highest circuit block. These digits are then available for the increase in the number of digits of the result due to the carry process.

The duration of the individual steps, and thus the clock cycle, are dimensioned such that the charge movements take place reliably. The duration of the individual steps is, in particular, between 1 ps and 1 ms.

In accordance with another feature of the invention, there is provided a circuit configuration that is particularly suitable for carrying out addition of binary numbers using an algorithm. For example, an algorithm which is known from S. C. Benjamin et al, Appl. Phys. Lett., Volume 70 (17), April 1997, pages 2321 to 2323, and which is herein fully incorporated by reference can be implemented with the circuit configuration. In this publication, the algorithm is implemented on a cellular device, constructed on the basis of quantum points. The information is in this case written by optical excitation, for example by means of a laser. No tunnel movements are allowed between the individual quantum points.

Appropriate digits in the binary numbers to be added are added in this addition algorithm. In this case, a sum and a carry are determined. When two multidigit binary numbers are added, this addition process is carried out in steps. This means that the sum and carry are first of all determined digit by digit. The carry is then added to the sum of the next-higher digit, once again producing a sum and a carry. The process is carried out n+1 times for n-digit binary numbers.

In the circuit configuration according to the invention, n+1 circuit blocks are required for addition of two n-digit binary numbers using this algorithm. The corresponding digits in the binary numbers to be added are in each case written to the first main node and the second main node in the corresponding first circuit portion. After the first run with three steps, the first main node in the first circuit portion contains the sum, and the second main node in the first circuit portion contains the carry. In the second run, the sum of the carry and the sum of the next-higher digit is now formed. In this case, use is made of the fact that the second main node in the first circuit portion is in each case connected to the first main node in the second circuit portion, and the second main node in the second circuit portion is connected to the first main node in the first circuit portion in the next circuit block. The first run and the second run of the process are then carried out alternately until a total of n+1 runs have been carried out. If n is an odd number, the first main node in the first circuit portions in each case contains a zero after this, while the second main node in the first circuit portions in each case contains the values of the individual digits of the sum. Since the first and second runs are carried out alternately, the digits of the binary number are in this case shifted through a total of (n+1)/2 circuit blocks. If n is an even number, the first main node in the first circuit portions after this in each case contains the value of the relevant digit of the sum, and the second main node in the first circuit portions in each case contains a zero. The digits of the binary numbers are shifted through n/2 circuit blocks.

All structures which have an electrically conductive area and which are insulated via an insulation structure from adjacent electrically conductive areas may be used as tunnel elements. The electrically conductive areas are connected via the insulation structure through tunnel contacts. Structures which have a conductive core and an insulating envelope surrounding the conductive core are particularly suitable for use as tunnel elements. The diameter of the tunnel element is in this case preferably between 1 and 10 nm. The capacitance of the tunnel elements in this order of magnitude is sufficiently low that the circuit configuration operates in the room-temperature range. In particular, metal clusters with organic ligands as the insulating envelope, as are known from DE 42 12 220 A1, or fullerene with an enclosed metal core, are suitable for use as tunnel elements.

Furthermore, lithographically structured thin metal layers are suitable for use as tunnel elements, in which case the tunnel contacts are produced by oxidation of such a metal layer and subsequent deposition and structuring of a further metal layer. Furthermore, δ-doped III-V semiconductors are suitable for use as tunnel elements. In the context of molecular electronics, sections of individual molecules are also suitable for use as tunnel elements, which may carry different charges depending on their previous history. The charge movement between such molecule sections whose charges may be reversed takes place along chemical bonds.

Other features which are considered as characteristic for the invention are set forth in the appended claims.

Although the invention is illustrated and described herein as embodied in a circuit configuration having single-electron components, a method for its operation, and use of the method for the addition of binary numbers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A–3L show the steps that are required for addition of two three-digit binary numbers.

DESCRIPTION OF THE EMBODIMENTS

Figure 1:
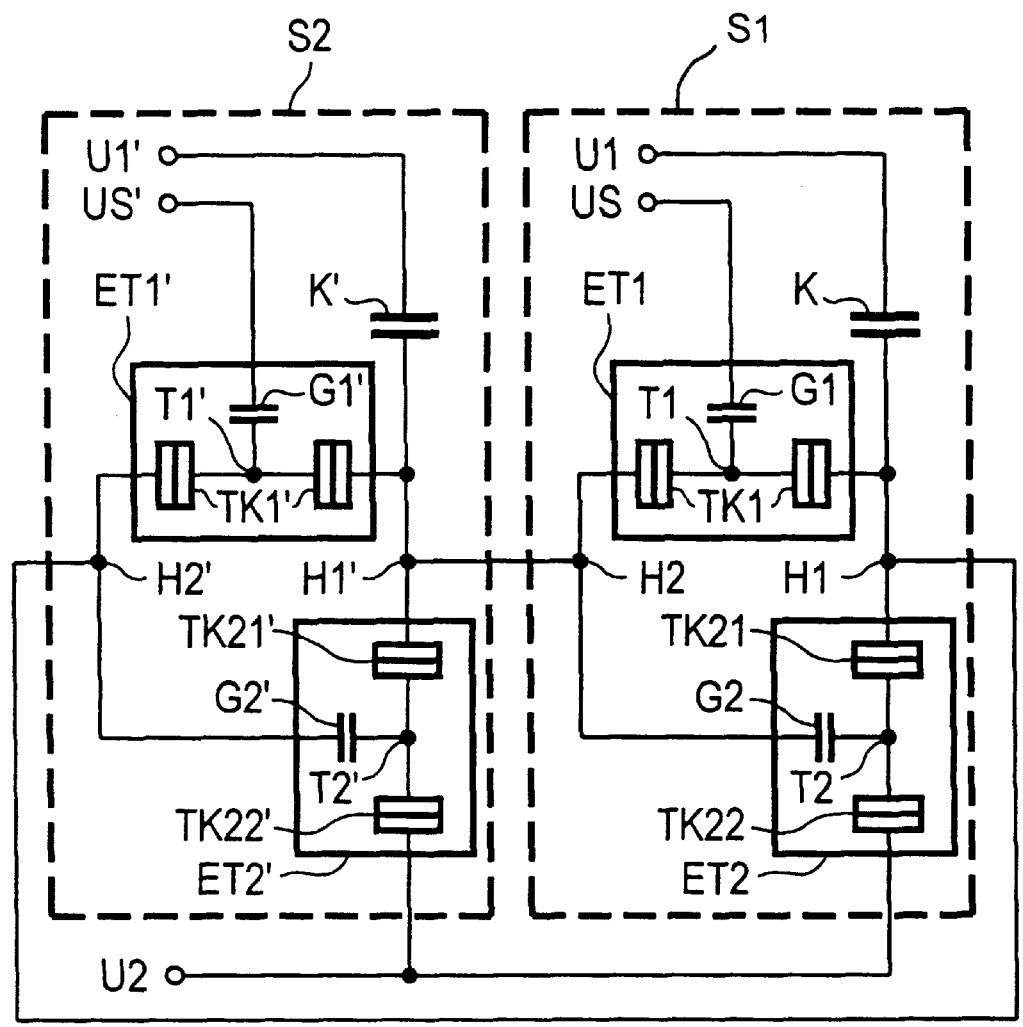
FIG. 1 shows a circuit configuration having a first circuit portion and a second circuit portion.

A circuit configuration has a first circuit portion S1 and a second circuit portion S2 (see FIG. 1). A first single-electron transistor ET1 and a second single-electron transistor ET2 as well as a capacitor K with a capacitance of 0.8 aF (a=atto= $10^{-18}$) are provided in the first circuit portion S1. The first single-electron transistor ET1 contains a tunnel element T1 which is configured between two tunnel contacts TK1 and can be actuated capacitively via a gate electrode G1. The gate electrode G1 has a capacitance of, for example, 0.4 aF, and the tunnel contacts TK1 each have a capacitance of, for example, 0.25 aF.

The second single-electron transistor ET2 has a tunnel element T2 which is configured between a first tunnel contact TK21 and a second tunnel contact TK2, and which can be actuated capacitively via a gate electrode G2. The gate electrode G2 has a capacitance of, for example, 0.2 aF. The first tunnel contact TK21 has a capacitance of 0.4 aF, and the second tunnel contact TK22 has a capacitance of 0.1 aF.

The first single-electron transistor ET1 and the second single-electron transistor ET2 are connected in series. In this case, one of the tunnel contacts TK1 of the first single-electron transistor ET1 and the first tunnel contact TK21 of the second single-electron transistor ET2 are connected to one another at a first main node H1. The first main node H1 is connected to a first operating voltage connection U1 via the capacitor K.

The series circuit comprising the first single-electron transistor ET1 and the second single-electron transistor ET2 is connected between a second main node H2 and a second operating voltage connection U2. The gate electrode G1 of the first single-electron transistor is connected to a control voltage connection US.

The second circuit portion S2 is designed analogously to the first circuit portion S1. This has a first single-electron transistor ET1' which is connected in series with a second single-electron transistor ET2'. The first single-electron transistor ET1' has a tunnel element T1' between two tunnel contacts TK1', and a gate electrode G1', which are dimensioned in a manner corresponding to the first single-electron transistor ET1 in the first circuit portion S1. The second single-electron transistor ET2' is analogous to the second single-electron transistor ET2 in the first circuit portion S1, and is designed analogously with a gate electrode G2', a tunnel element T2', a first tunnel contact TK21' and a second tunnel contact TK22'. The first single-electron transistor ET1' and the second single-electron transistor ET2' are connected to one another via a first main node H1'. The first main node H1' is connected via a capacitor K', with a capacitance of 0.8 aF, to a first operating voltage connection U1'. The series-connected single-electron transistors ET1', ET2' are connected between the second main node H2' and the second operating voltage connection U2. The gate electrode G1' of the first single-electron transistor ET1' is connected to a control voltage connection US'. The gate electrode G2' of the second single-electron transistor ET2' is connected to the second main node H2'.

The second main node H2 in the first circuit portion S1 is connected to the first main node H1' in the second circuit portion S2. The first main node H1 in the first circuit portion S1 is connected to the second main node H2' in the second circuit portion S2. Thus, when the second single-electron transistor ET2 in the first circuit portion is actuated, both charge stored at the second main node H2 in the first circuit portion S1 and the voltage level which is applied to the first operating voltage connection U1' in the second circuit portion S2 are active. In a corresponding manner, when the gate electrode G2' of the second single-electron transistor ET2' is actuated, both the charge located at the second main node H2' in the second circuit portion S2 and the voltage applied to the first operating voltage connection U1 in the first circuit portion S1 are active.

To operate the circuit configuration, one run is carried out, with three steps. In the first step, 0.17 volts is applied to the first operating voltage connection U1 in the first circuit portion S1, 0.2 volts is applied to the control voltage connection US in the first circuit portion S1, and 0 volts is applied to both the first operating voltage connection U1' and the control voltage connection US' in the second circuit portion S2. In the second step, 0.03 volts is applied to the first operating voltage connection U1, 0 volts is applied to the control voltage connection US, 0.1 volts is applied to the first operating voltage connection U1', and 0 volts is applied to the control voltage connection US'. In the third step, −0.14 volts is applied to the first operating voltage connection U1, −0.1 volts is applied to the control voltage connection US, 0.12 volts is applied to the first operating voltage connection U1', and −0.1 volts is applied to the control voltage connection US'.

After these three steps, the logic values which are stored at the first main node H1 and at the second main node H2 in the first circuit portion S1 are logically operated on in accordance with the truth table

| Information at the 2nd main node | Information at the 1st main node | |
|---|---|---|
| | 0 | 1 |
| 0 | 00 | 01 |
| 1 | 01 | 10 | so that the AND logic operation on the output bits is present at the second main node H2, and the XOR logic operation is present at the first main node H1.

Figure 2A:
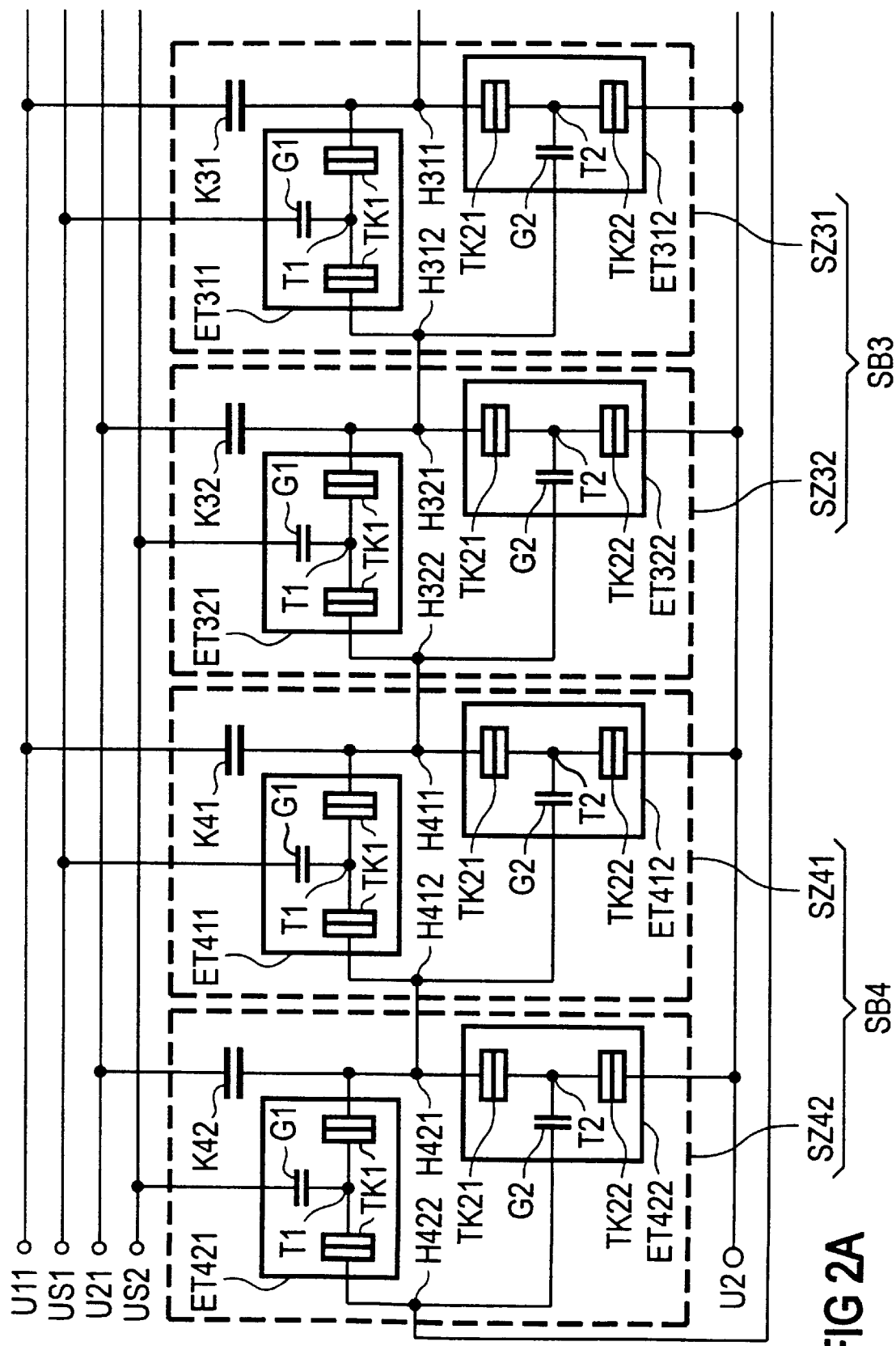
FIGS. 2A–2B show a circuit configuration having four circuit blocks, which is suitable for addition of two three-digit binary numbers.
Figure 2B:
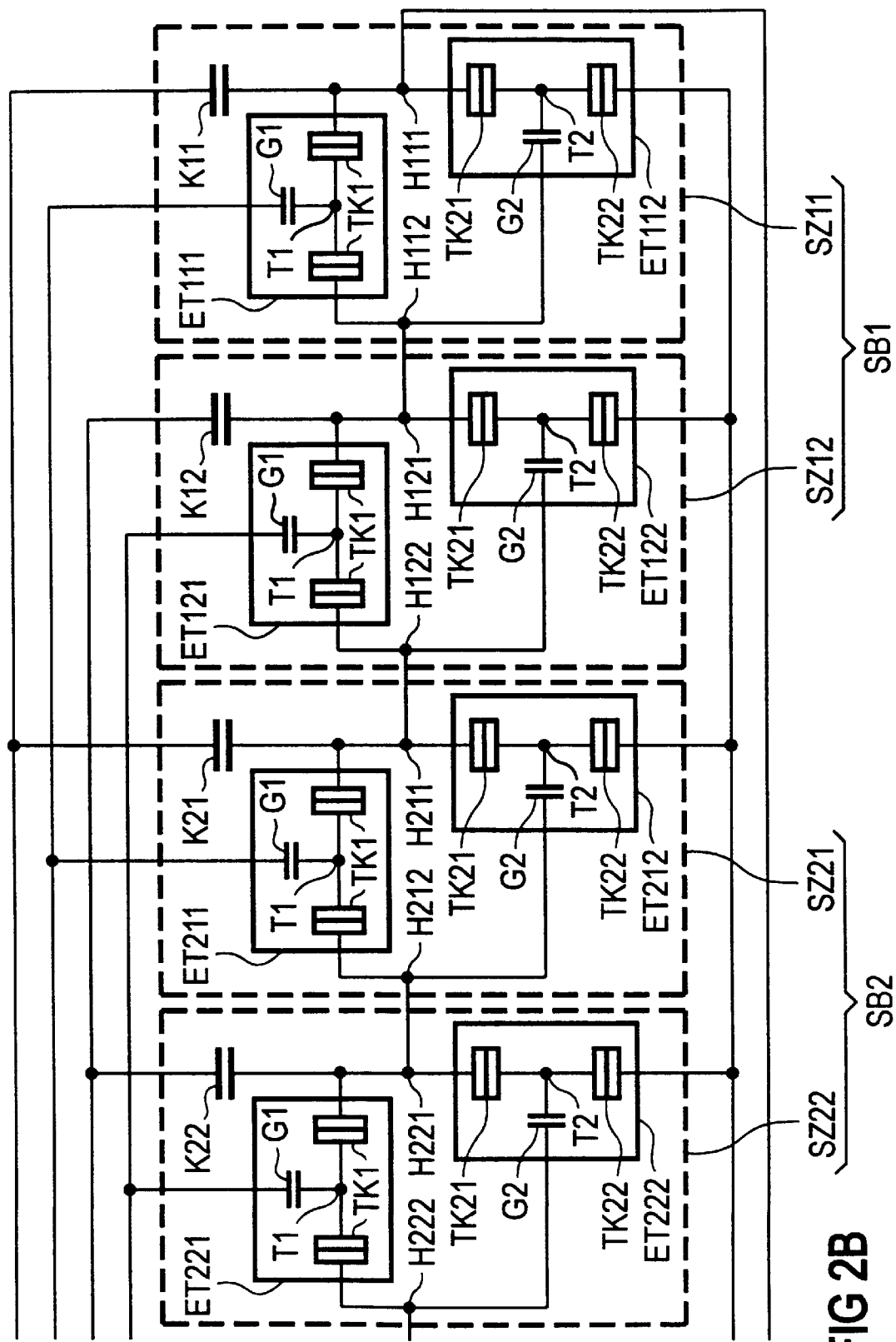

A circuit configuration for performing logic operations on two three-digit binary numbers to add the numbers has four circuit blocks SBi, i=1, 2, 3, 4 (see FIG. 2). Each of the circuit blocks SBi contains a first circuit portion SZi1 and a second circuit portion SZi2, i=1, 2, 3, 4.

In the first circuit portion SZi1, a first single-electron transistor ETi11 and a second single-electron transistor ETi12 are connected in series with one another via a first main node Hi11. The first main node Hi11 is connected via a capacitor Ki1 to a first operating voltage connection U11. The series circuit comprising the first single-electron transistor ETi11 and the second single-electron transistor ETi12 is connected between a second main node Hi12 and a second operating voltage connection U2. The gate electrode G1 of the first single-electron transistor ETi1 is connected to a control voltage connection US1. The gate electrode G2 of the second single-electron transistor ETi12 is connected to the second main node Hi12. In this case, i=1, 2, 3, 4 in each case.

The second circuit portion SZi2 is designed analogously to the first circuit portion SZi1. It in each case has a first single-electron transistor ETi21 and a second single-electron transistor ETi22, which are connected in series with one another via a first main node Hi21. The first main node Hi21 is connected via a capacitor Ki2 to a first operating voltage connection U21. The series circuit comprising the first single-electron transistor ETi21 and the second single-electron transistor ETi22 is connected between a second main node Hi22 and the second operating voltage connection U2. The gate electrode G1 of the first single-electron transistor ETi21 is connected to a control voltage connection US2. The gate electrode G2 of the second single-electron transistor ETi22 is connected to the second main node Hi22. In this case, i=1, 2, 3, 4 in each case.

The second main node Hi22 of the second circuit portion SZi2, for i=1, 2, 3, is in each case connected to the first main node Hi+11 in the first circuit portion SZi+11 of the i+1-th circuit block SBi+1. The second main node H422 in the second circuit portion SZ42 of the fourth circuit block SB4 is connected to the first main node H111 in the first circuit portion SZ11 of the first circuit block SB1. This results in a cyclic circuit structure.

The first single-electron transistors ETi11 in the first circuit portions SZi1 and the first single-electron transistors ETi21 in the second circuit portions SZi2 are in each case designed essentially identically. They have a tunnel element T1 which is connected via two tunnel contacts TK1 to the adjacent first main nodes Hij1 and second main nodes Hij2, i=1 to 4, j=1, 2. The tunnel element T1 can be actuated capacitively via the gate electrode G.

The capacitors Kij, i=1 to 4, j=1, 2 are likewise designed essentially identically.

The second single-electron transistors ETij2, i=1 to 4, j=1, 2 are likewise designed essentially identically. They each have a tunnel element T2 which is connected via a first tunnel contact TK21 to the adjacent first main node Hij1, and via a second tunnel contact TK22 to the second operating voltage connection U2. The tunnel element T2 can be actuated capacitively via the gate electrode G2.

The capacitances of the components of the single-electron transistors ETijk, i=1 to 4, j=1, 2, k=1, 2 and the capacitances of the capacitors Kij, i=1 to 4, j=1, 2 are, for example, dimensioned as follows:

| G1 | Kij | TK1 | G2 | TK21 | TK22 |
|---|---|---|---|---|---|
| 0.4 aF | 0.8 aF | 0.25 aF | 0.2 aF | 0.4 aF | 0.1 aF |

For a logic operation on two binary numbers, a first run with the steps 1.1, 1.2, 1.3 and a second run with the steps 2.1, 2.2, 2.3 are carried out alternately or repetitively.

Overall, four runs are required for addition of two three-digit binary numbers, in which case the voltage profiles of the third run are identical to those of the first run, and those of the fourth run are identical to those of the second. The second operating voltage connection U2 is in this case at ground potential. The first operating voltage connections U11, U21 and the control voltage connections US1, US2 have the following voltage levels applied to them in the individual steps:

| No. | Step | | | | | |
|---|---|---|---|---|---|---|
| Connection | 1.1 | 1.2 | 1.3 | 2.1 | 2.2 | 2.3 |
| U11 [V] | 0.17 | 0.03 | −0.14 | 0 | 0.1 | 0.12 |
| US1 [V] | 0.2 | 0 | −0.1 | 0 | 0 | −0.1 |
| U21 [V] | 0 | 0.1 | 0.12 | 0.17 | 0.03 | −0.14 |
| US2 [V] | 0 | 0 | −0.1 | 0.2 | 0 | −0.1 |

Alternatively, the following voltage levels are applied, with the same capacitances.

| No. | Step | | | | | |
|---|---|---|---|---|---|---|
| Connection | 1.1 | 1.2 | 1.3 | 2.1 | 2.2 | 2.3 |
| U11 [V] | 0.1 | 0.04 | −0.12 | −0.06 | 0.03 | 0.11 |
| US1 [V] | 0.14 | 0.04 | −0.09 | −0.03 | 0 | −0.09 |
| U21 [V] | −0.06 | 0.03 | 0.11 | 0.1 | 0.04 | −0.12 |
| US2 [V] | −0.03 | 0 | −0.09 | 0.14 | 0.04 | −0.09 |

The capacitances of the capacitors Kij and of the single-electron transistors ETijk, i=1 to 4, j=1, 2, k=1, 2 are dimensioned as follows:

| G1 | Kij | TK1 | G2 | TK21 | TK22 |
|---|---|---|---|---|---|
| 0.5 aF | 0.7 aF | 0.15 aF | 0.1 aF | 0.3 aF | 0.1 aF |

In this case, the first operating voltage connections U11, U21 and the control voltage connections US1, US2 have the following voltage levels applied to them:

| No. | Step | | | | | |
|---|---|---|---|---|---|---|
| Connection | 1.1 | 1.2 | 1.3 | 2.1 | 2.2 | 2.3 |
| U11 [V] | 0.09 | 0.03 | −0.14 | −0.08 | 0.01 | 0.03 |
| US1 [V] | 0.07 | −0.02 | −0.13 | −0.08 | −0.05 | −0.13 |
| U21 [V] | −0.08 | 0.01 | 0.03 | 0.09 | 0.03 | −0.14 |
| US2 [V] | −0.08 | −0.05 | −0.13 | 0.07 | −0.02 | −0.13 |

The invention is not limited to the stated capacitance values and voltage levels. It is within the scope of specialist knowledge to use other capacitance values and voltage levels.

The addition of two binary numbers using the circuit configuration shown in FIG. 2 will be explained step-by-step, using an example, with reference to FIGS. 3A–3L. For the sake of clarity, FIGS. 3A–3L show only the first main nodes Hij1, the tunnel elements T1 of the first single-electron transistors ETij1, and the second single-electron transistors ETij2. Apart from this, the illustrated circuit configuration in each case corresponds to what has been described with reference to FIG. 2. The presence of an electron at a main node or a tunnel element is denoted by x in FIGS. 3A–3L.

The procedure for adding the numbers 7+3, 111+011 in binary notation, is as follows: the numbers to be added are in each case written to the first main nodes Hij1. In the process, the digits of the first summand 3 (011) are in each case written to the first main node Hi11 in the first circuit portions SZi1. The digits of the second summand 7 (111) are written to the first main nodes Hi21 in the second circuit portions SZi2. To aid in understanding the procedure, it should be noted that the first main nodes H111, H121, H211, H221, H311, H321, H411, H421 are respectively connected to the adjacent second main node H422, H112, H122, H231, H222, H312, H322, H412, and thus the same charge acts at the corresponding second main node.

For a one, an electron is in each case applied to the corresponding main node, while no electron is applied to the main node for a zero. The electrons are in each case introduced via the second operating voltage connection U2, with appropriate actuation of the single-electron transistors. The second operating voltage connection U2 in the respective circuit portion SZij has an appropriate voltage level applied to it for this purpose.

The first main nodes H411 and H421 of the fourth circuit block SB4 have a zero applied to them.

After this, the main nodes H421, H411, H311 each have a zero applied to them, and the main nodes H321, H221, H121 and H111 each have a one applied to them. An electron is thus located t each of the main nodes H321, H211, H121 and H111 (see FIG. 3A).

In a first step 1.1, electrons are shifted from the first main node Hi21 in the second circuit portions SZi2 to the tunnel element T1 of the first single-electron transistor ETi11, provided there is an electron at the associated first main node Hi11. If the associated main node Hi11 in the first circuit portion SZi1 does not have an electron in it, the electron is shifted from the first main node Hi21 in the first circuit portion SZi2 to the first main node Hi11 in the first circuit portion SZi1. This results in the situation shown in FIG. 3B. One electron is thus in each case located at the main nodes H311, H211, H111 and the tunnel elements T1 of the single-electron transistors ET211 and ET111.

In step 1.2, electrons are shifted from the tunnel element T1 of the single-electron transistor ETi11 to the associated first main node Hi21 in the second circuit portion SZi2. This results in the situation shown in FIG. 3C. An electron is located at each of the main nodes H311, H211, H111, H221, H121.

In step 1.3, in the circuit blocks SBi in which both the first main node Hi21 in the second circuit portion SZi2 and the first main node Hi11 in the first circuit portion SZi1 are filled with an electron, the second single-electron transistors ETi12 are actuated such that the electron flows from the first main node Hi11 to the second operating voltage connection U2. This results in the situation shown in FIG. 3D. An electron is located at each of the main nodes H311, H221, H121.

Step 2.1 is then carried out, which is analogous to step 1.1, but in which the role of the first circuit portions SZi1 is interchanged with that of the second circuit portions SZi2. In this case, one electron is shifted from the first main nodes H411, H311, H211, H111 to the tunnel element T1 of the first single-electron transistor ET321, ET221, ET121, ET421 in the respective second circuit portion SZi2 or to the first main nodes H321, H221, H121, H421, depending on whether an electron is or is not located at the second main node. This results in the situation shown in FIG. 3E. An electron is located at each of the main nodes H221, H121, and at the tunnel element T1 of the single-electron transistor ET221.

Now, in step 2.2, the electrons located at tunnel elements T1 are shifted to the adjacent first main nodes H411, H311, H211, H111, provided the adjacent first main node H321, H221, H121, H421 has an electron. This results in the situation shown in FIG. 3F. An electron is located at each of the main nodes H311, H221, H121.

In step 2.3, electrons which are located at the second main nodes H321, H221, H121, H421 are moved to the second operating voltage connection U2, provided an electron is located at each of the adjacent first main nodes H411, H311, H211, H111. This results in the situation shown in FIG. 3G. An electron is located at each of the main nodes H311, H121.

Step 1.1 is then carried out, resulting in the situation shown in FIG. 3H. An electron is located at each of the main nodes H311, H111.

Step 1.2 is then carried out, resulting in the situation shown in FIG. 3I. An electron is located at each of the main nodes H311, H111. Since, in this example, there are no electrons at tunnel elements after this step 1.1 nothing changes in this step.

Step 1.3 is then carried out, resulting in the situation shown in FIG. 3J. An electron is located at each of the main nodes H311, H111. Since, in this example, there are no electrons at adjacent first main nodes after this step 1.2, nothing changes in this step.

Figure 3A:
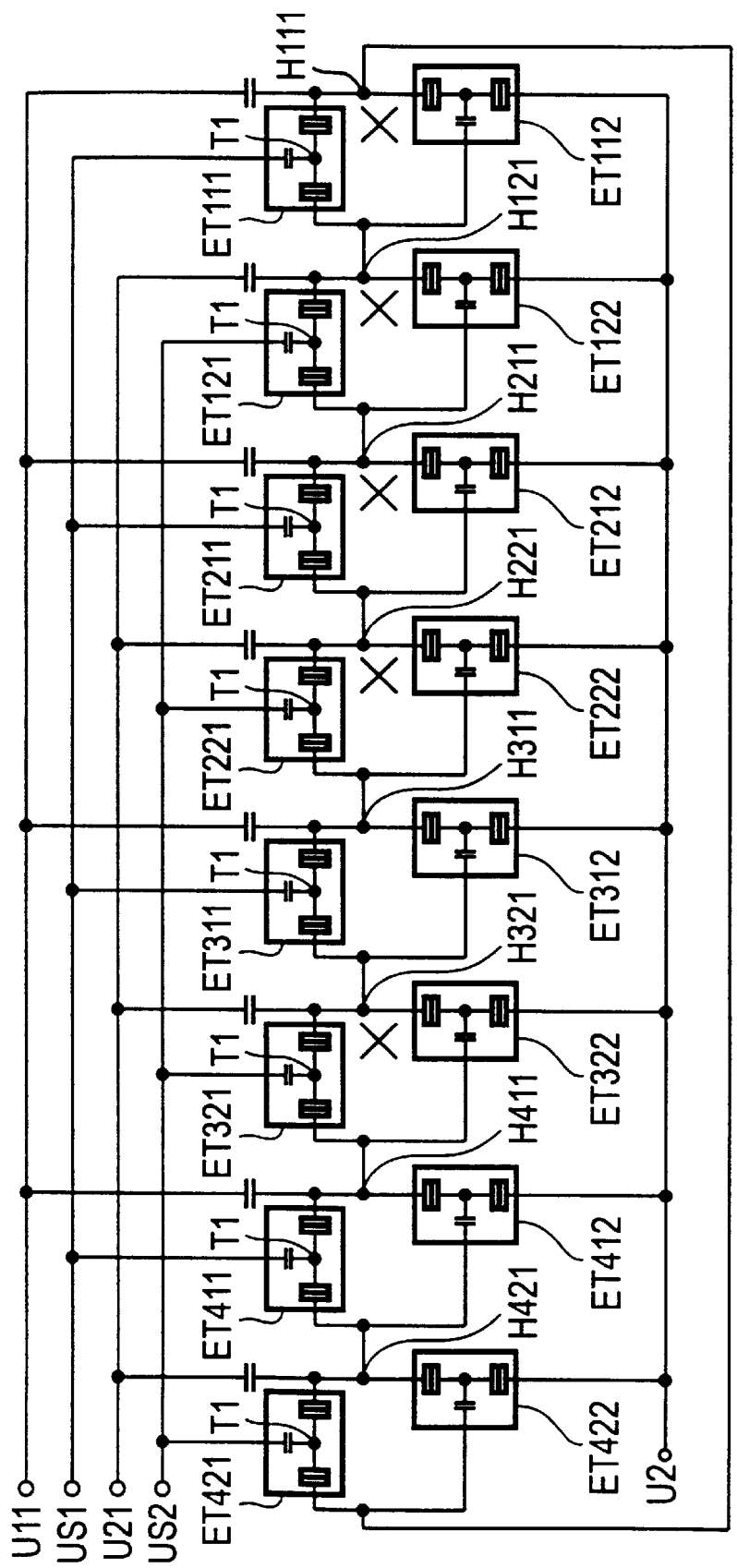
Figure 3B:
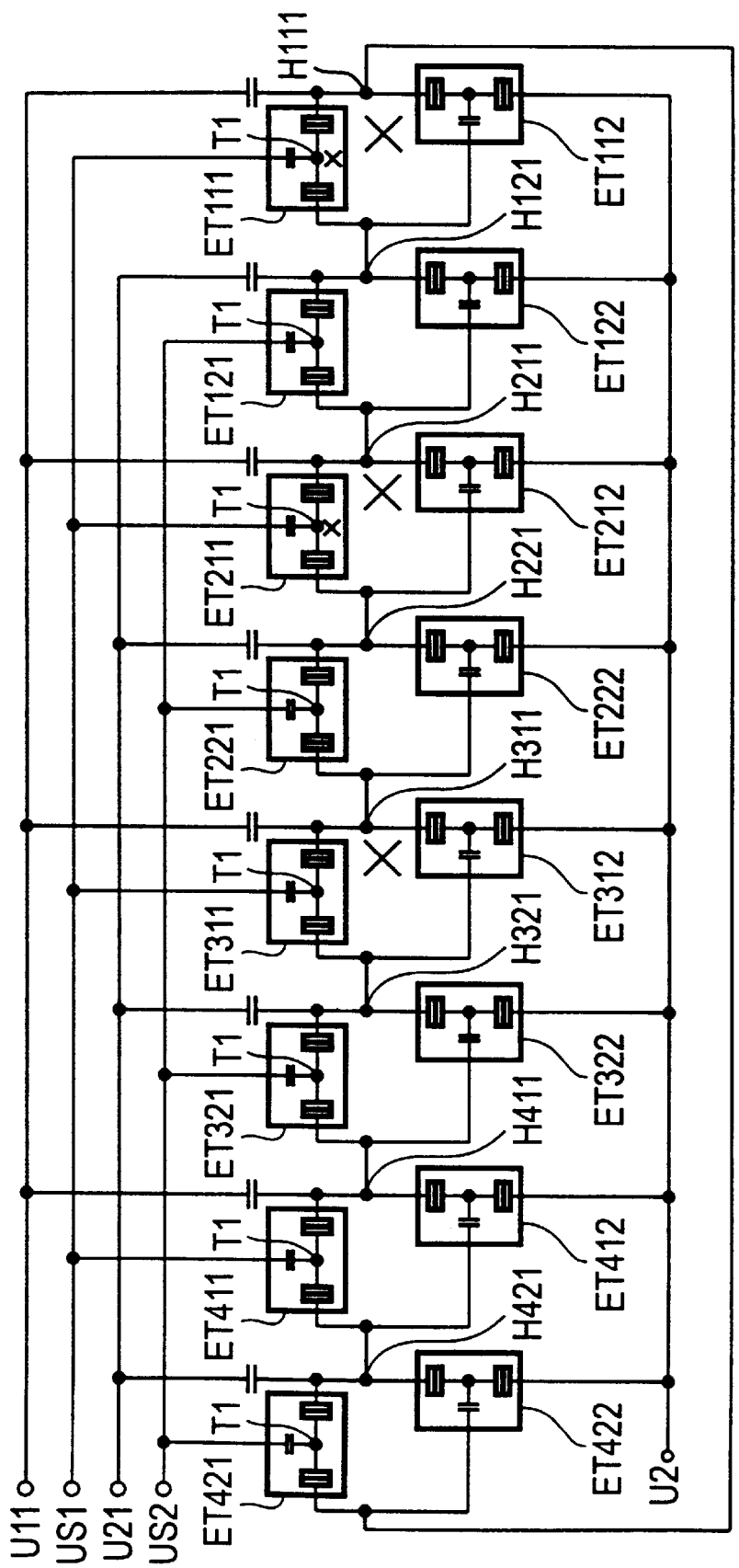
Figure 3D:
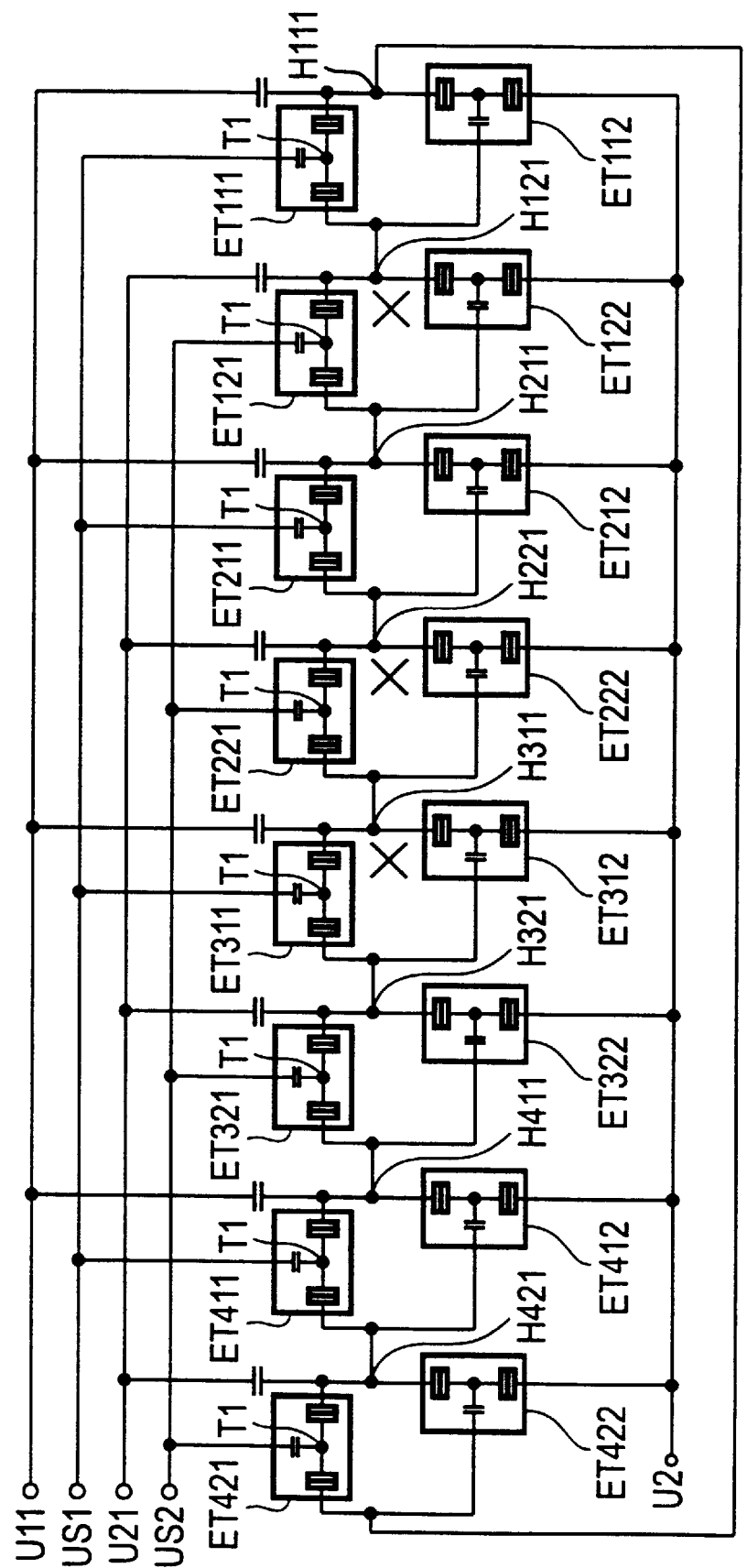
Figure 3E:
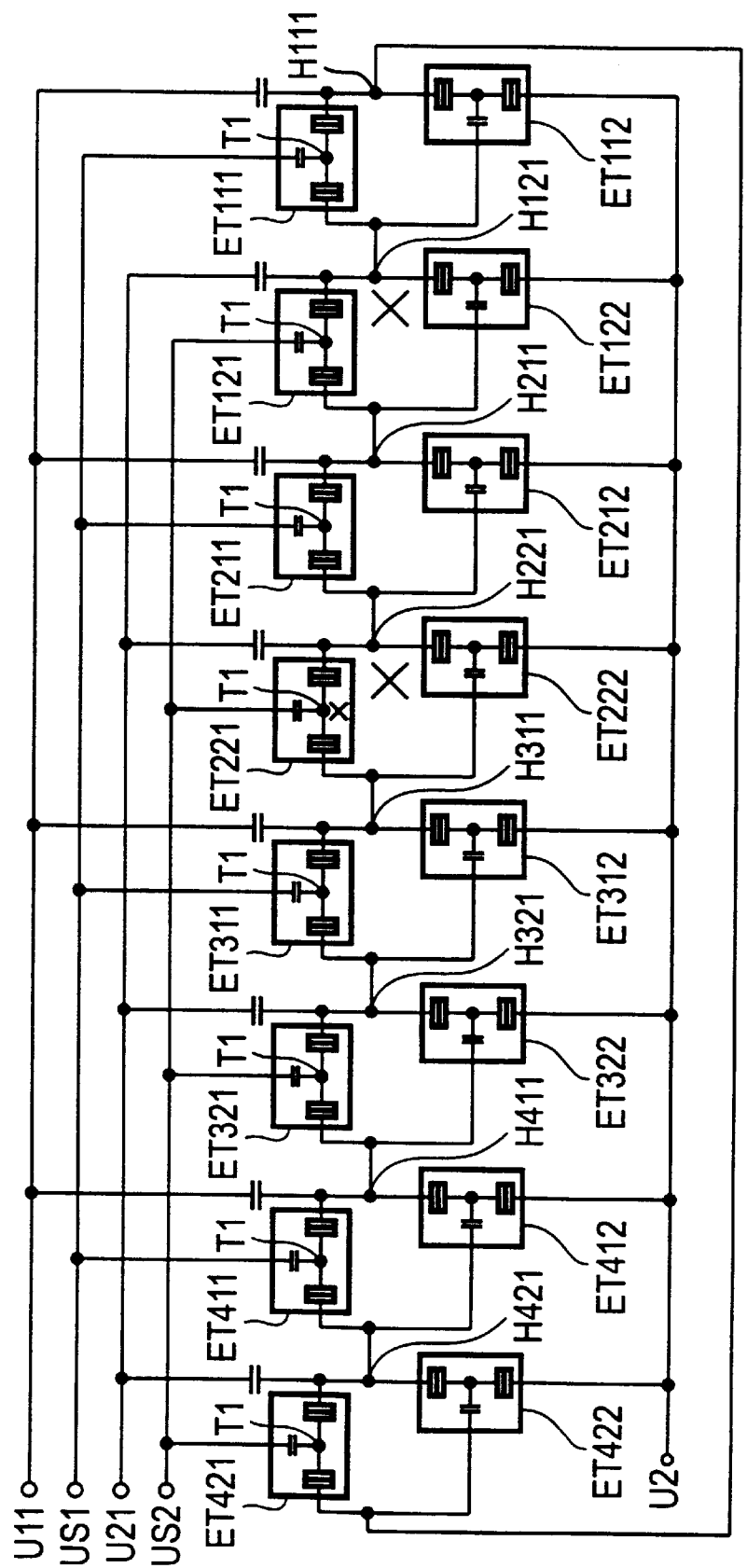
Figure 3F:
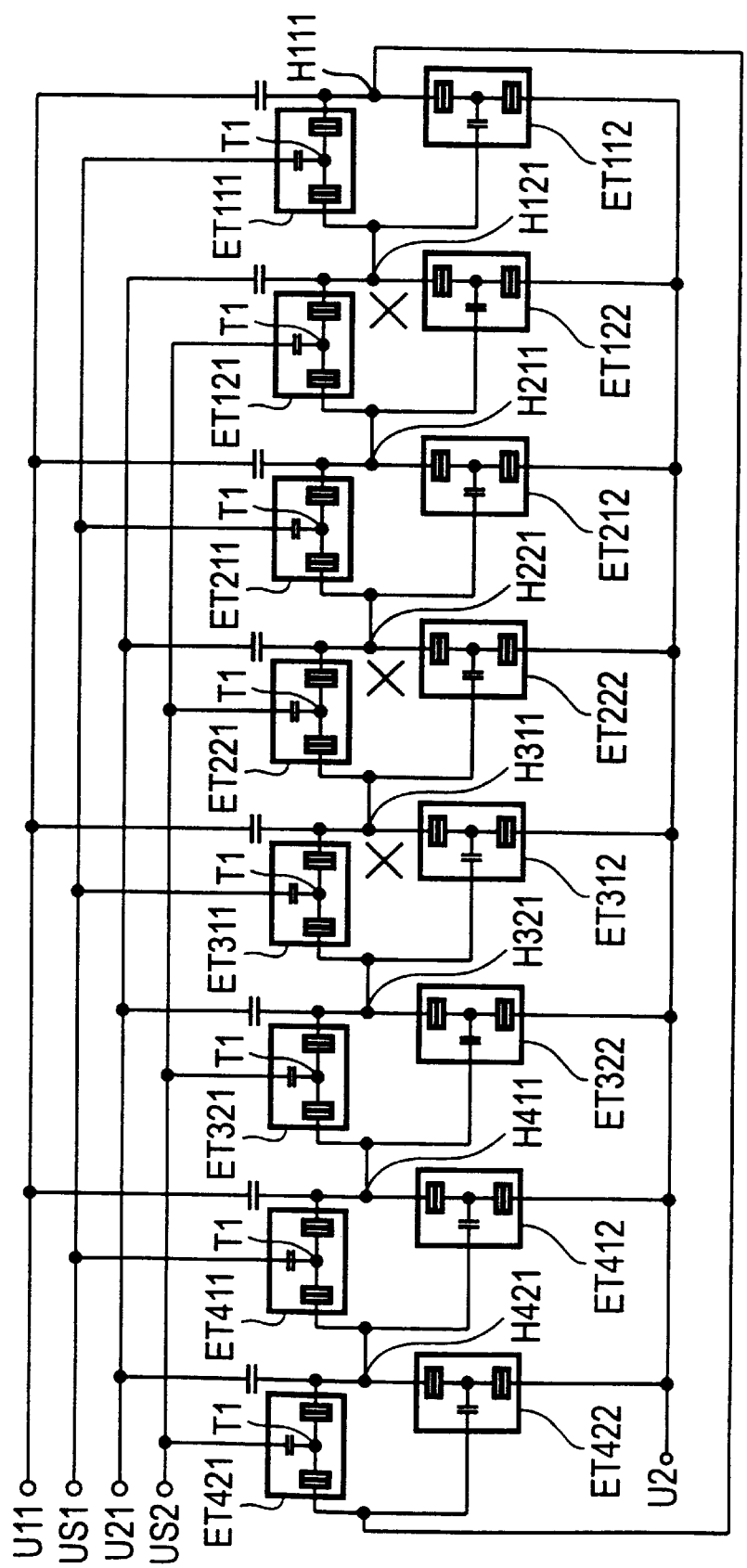
Figure 3G:
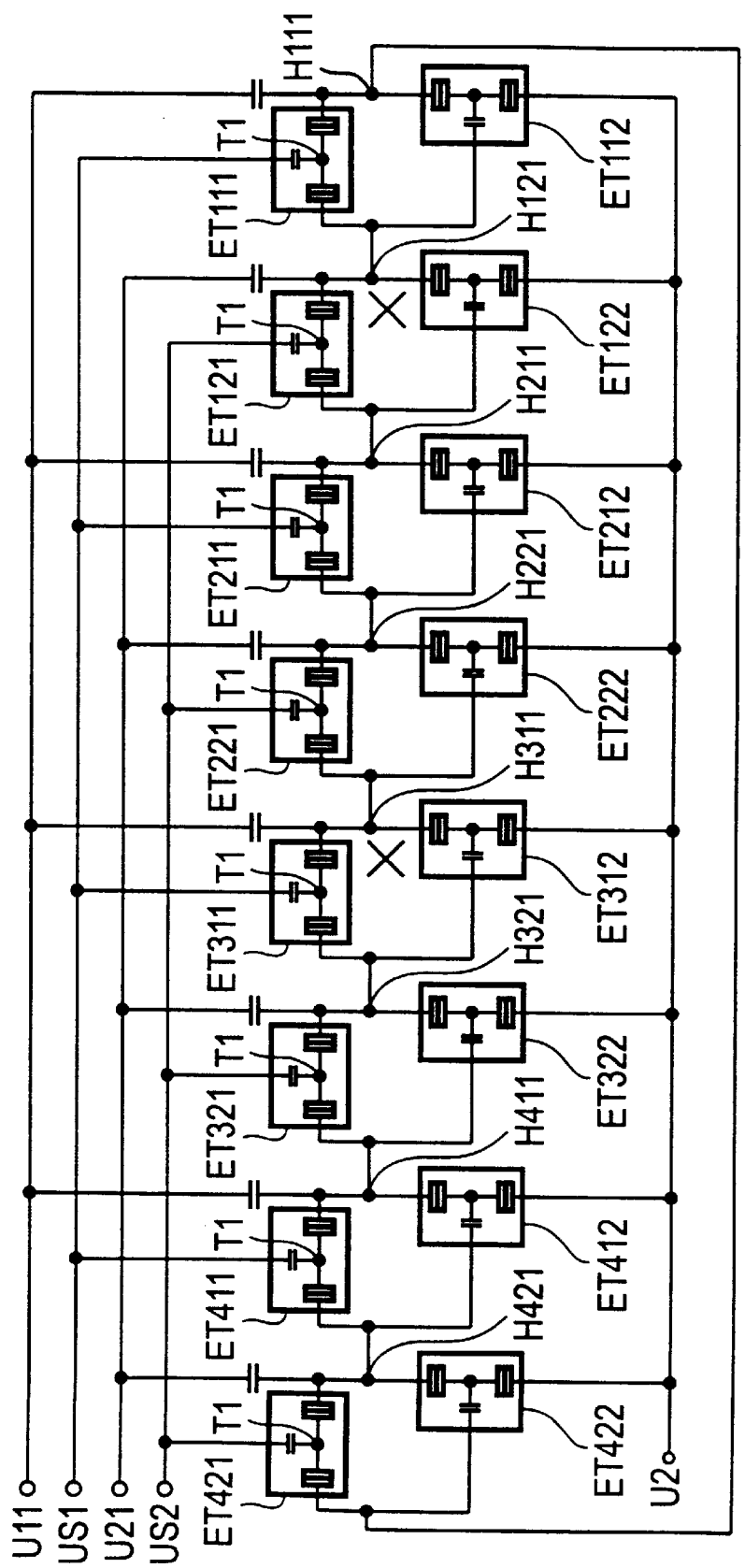
Figure 3K:
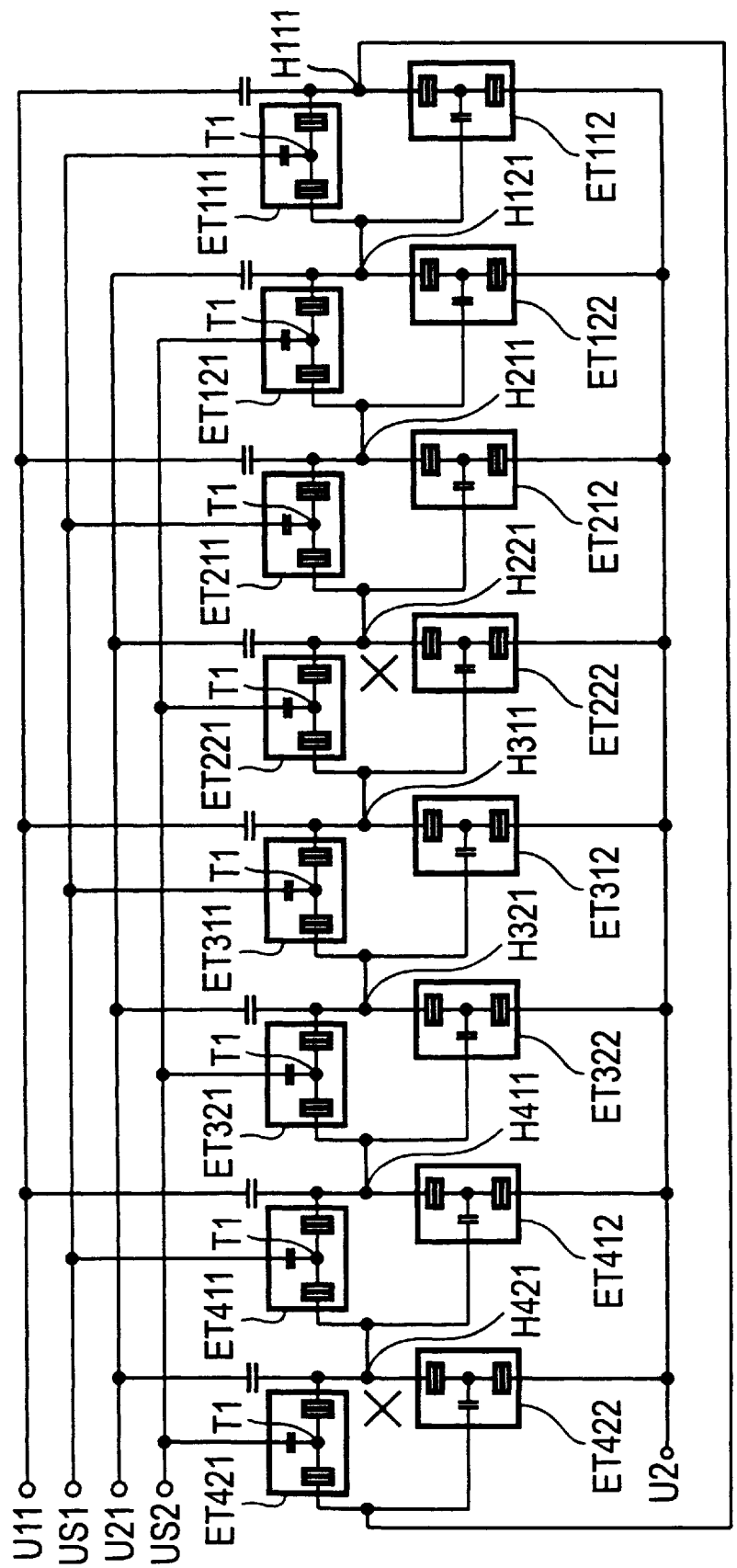

Step 2.1 is then carried out, resulting in the situation shown in FIG. 3K. An electron is located at each of the main nodes H421, H221.

Figure 3L:
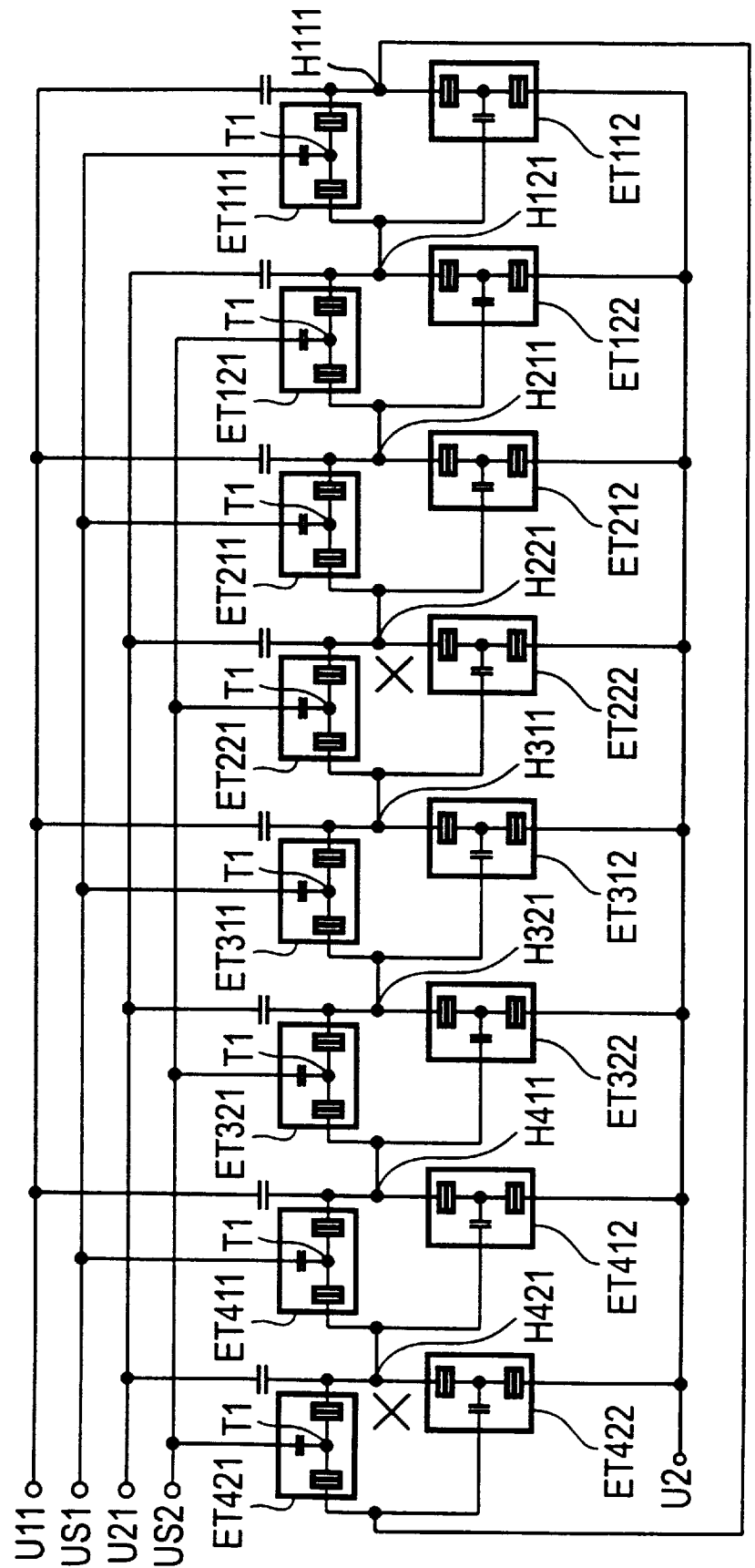

The use of steps 2.2 and 2.3 no longer changes the charge at the main nodes in this example, giving the result shown in FIG. 3L. An electron is located at each of the main nodes H421, H221. The main nodes Hi11 are set to zero. The digits in the sum number can be taken from the first main nodes Hi21 in the second circuit portions SZi2. The digits are shifted through two circuit blocks from the original position. The voltage levels mentioned in conjunction with FIG. 2 are used for the addition process in the steps 1.1, 1.2, 1.3, 2.1, 2.2, 2.3.

We claim:

1. A circuit configuration having single-electron components, comprising:
   a control voltage connection for receiving a control voltage;
   a first operating voltage connection for receiving a first operating voltage;
   a second operating voltage connection for receiving a second operating voltage;
   a first main node and a second main node;
   a capacitor connecting said first main node to said first operating voltage connection;
   a first single-electron transistor located between said first main node and said second main node for electrically connecting said first main node and said second main node, said first single-electron transistor having a gate electrode connected to said control voltage connection; and
   a second single-electron transistor having a gate electrode connected to said second main node, said second single-electron transistor electrically connecting said first main node and said second operating voltage connection.

2. The circuit configuration according to claim 1, comprising:
   at least one first circuit portion including said control voltage connection, said first operating voltage connection, said second operating voltage connection, said first main node, said second main node, said capacitor, said first single-electron transistor, and said second single-electron transistor, said first single-electron transistor connected in series with said second single-electron transistor via said first main node; and
   at least one second circuit portion including:
      a control voltage connection for receiving a control voltage;
      a first operating voltage connection for receiving a first operating voltage;
      a second operating voltage connection for receiving a second operating voltage;
      a first main node and a second main node;
      a capacitor connecting said first main node to said first operating voltage connection;
      a first single-electron transistor having a gate electrode connected to said control voltage connection; and
      a second single-electron transistor having a gate electrode connected to said second main node, said second single-electron transistor electrically connecting said first main node and said second operating voltage connection;
      said first single-electron transistor connected in series with said second single-electron transistor via said first main node;
   said first main node of said second circuit portion connected to said second main node of said first circuit portion.

3. The circuit configuration according to claim 2, wherein said second main node of said second circuit portion is connected to said first main node of said first circuit portion.

4. The circuit configuration according to claim 2, comprising:
   n circuit blocks including a first circuit block and an n-th circuit block, each one of said n circuit blocks having one said at least one first circuit portion and one said at least one second circuit portion, n being equal to or greater than 2;
   said second main node of each i-th circuit block of said n circuit blocks connected to said first main node of said first circuit portion of an i+1-th circuit block of said n circuit blocks, where i=1 to n-1;
   said second main node of said second circuit portion of said n-th circuit block connected to said first main node of said first circuit portion of said first circuit block.

5. The circuit configuration according to claim 2, wherein said capacitor of said first circuit portion and said capacitor of said second circuit portion are substantially identically designed;
   said first single-electron transistor of said first circuit portion and said first single-electron transistor of said second circuit portion are substantially identically designed; and
   said second single-electron transistor of said first circuit portion and said second single-electron transistor of said second circuit portion are substantially identically designed.

6. The circuit configuration according to claim 2, wherein:
   said first single-electron transistor of said first circuit portion has two tunnel contacts with a substantially similar capacitance;
   said first single-electron transistor of said second circuit portion has two tunnel contacts with a substantially similar capacitance;

said second single-electron transistor of said first circuit portion has two tunnel contacts with a substantially similar capacitance; and said second single-electron transistor of said second circuit portion has two tunnel contacts with a substantially similar capacitance.

7. The circuit configuration according to claim 2, wherein said second operating voltage connection of said first circuit portion is connected to said second operating voltage connection of said second circuit portion.

8. A method for operating the circuit configuration according to claim 2, which comprises:

providing said first single-electron transistor of said first circuit portion with a tunnel junction;

applying a first voltage level to said first operating connection of said first circuit portion;

applying a second voltage level to said control connection of said first circuit portion;

applying a third voltage level to said first operating connection of said second circuit portion;

applying a fourth voltage level to said control connection of said second circuit portion;

in a first step, setting the first voltage level, the second voltage level, the third voltage level, and the fourth voltage level such that:

a charge carrier that is located at said second main node of said first circuit portion flows to said first main node of said first circuit portion, if a charge carrier is not already present at said first main node; and a charge carrier that is located at said second main node of said first circuit portion flows to said tunnel junction of said first single electron transistor of said first circuit portion, if a charge carrier is present at said first main node;

in a second step, setting the first voltage level, the second voltage level, the third voltage level, and the fourth voltage, level such that:

a charge carrier that is located at said tunnel junction of said first single-electron transistor of said first circuit portion flows to said second main node of said first circuit portion; and in a third step, setting the first voltage level, the second voltage level, the third voltage level, and the fourth voltage level such that:

a charge carrier that is located at said first main node of said first circuit portion flows through said second single-electron transistor of said first circuit portion to said second operating voltage connection of said first circuit portion, if a charge carrier is present at said second main node of said first circuit portion.

9. The method according to claim 8, wherein the previously defined steps define a first sequence and which further comprises:

a second sequence performed subsequent to the first sequence and including:

applying the third voltage level to said first operating connection of said first circuit portion;

applying the fourth voltage level to said control connection of said first circuit portion;

applying the first voltage level to said first operating connection of said second circuit portion;

applying the second voltage level to said control connection of said second circuit portion;

in a first step, setting the first voltage level, the second voltage level, the third voltage level, and the fourth voltage level to the levels defined in the first step of the first sequence;

in a second step, setting the first voltage level, the second voltage level, the third voltage level, and the fourth voltage level to the levels defined in the second step of the first sequence; and in a third step, setting the first voltage level, the second voltage level, the third voltage level, and the fourth voltage level to the levels defined in the third step of the first sequence.

10. The method according to claim 9, which further comprises alternately performing the first sequence and the second sequence.

11. The method according to claim 10, which further comprises using the defined steps to add binary numbers.

12. The method according to claim 9, which further comprises using the defined steps to add binary numbers.

* * * * *